(12) United States Patent
Tainoff et al.

(10) Patent No.: US 11,988,564 B2
(45) Date of Patent: May 21, 2024

(54) AUTONOMOUS ON-BOARD TEMPERATURE MEASUREMENT DEVICE AND METHOD IMPLEMENTED BY THIS DEVICE

(71) Applicants: CENTRE NATIONAL DE LA RECHERCHE SCIENTIFIQUE, Paris (FR); UNIVERSITE GRENOBLE ALPES, Saint Martin d'Heres (FR)

(72) Inventors: Dimitri Tainoff, Grenoble (FR); Olivier Bourgeois, Saint Laurent du Pont (FR); Anaïs Proudhom, Grenoble (FR)

(73) Assignees: CENTRE NATIONAL DE LA RECHERCHE SCIENTIFIQUE, Paris (FR); UNIVERSITE GRENOBLE ALPES, Saint Martin d'Heres (FR)

( * ) Notice: Subject to any disclaimer, the term of this patent is extended or adjusted under 35 U.S.C. 154(b) by 619 days.

(21) Appl. No.: 17/271,534

(22) PCT Filed: Aug. 30, 2019

(86) PCT No.: PCT/EP2019/073274
§ 371 (c)(1),
(2) Date: Feb. 25, 2021

(87) PCT Pub. No.: WO2020/048894
PCT Pub. Date: Mar. 12, 2020

(65) Prior Publication Data
US 2021/0255045 A1      Aug. 19, 2021

(30) Foreign Application Priority Data

Sep. 3, 2018 (FR) ..................................... 1857905

(51) Int. Cl.
*G01K 1/14* (2021.01)
*B61K 9/04* (2006.01)
(Continued)

(52) U.S. Cl.
CPC .................. *G01K 1/14* (2013.01); *B61K 9/04* (2013.01); *G01K 1/024* (2013.01); *G01K 7/02* (2013.01);
(Continued)

(58) Field of Classification Search
CPC ........... G01K 1/14; G01K 1/024; G01K 7/02; G01K 13/08; G01K 2215/00; H01N 10/80; H01N 10/17; B61K 9/04
See application file for complete search history.

(56) References Cited

U.S. PATENT DOCUMENTS 9,435,819 B1* 9/2016 Fraley ..................... G01P 15/08
2016/0047697 A1* 2/2016 Decker .................. G01K 1/143
374/179
2019/0222055 A1* 7/2019 Khoche ............. G06K 19/0704

FOREIGN PATENT DOCUMENTS

RS        20140604 A       6/2016
WO      2015100425 A1     7/2015

OTHER PUBLICATIONS

Lenon H., "Autonomous and communicating monitoring kit for rail and rolling stock," European Mechatronics Meeting (EMM), 2015, Senlis, France, 32 pages. (English Summary Provided).
(Continued)

*Primary Examiner* — Randy W Gibson
(74) *Attorney, Agent, or Firm* — Greer, Burns & Crain, Ltd

(57) ABSTRACT

A temperature measurement device includes: a temperature sensor designed to measure a temperature, a thermo-generator forming, with the temperature sensor, what is known as a measurement surface, the thermo-generator being configured to convert thermal energy of the measurement surface into electrical energy, and the sensor being designed to measure a temperature of a sample in contact with the measurement surface, and an electronic board designed to
(Continued)

receive the electrical energy converted by the thermo-generator and supply the temperature sensor, the device including the electronic board is positioned a non-zero distance away from the measurement surface in a direction perpendicular to the measurement surface.

17 Claims, 2 Drawing Sheets

(51) Int. Cl.
*G01K 1/02* (2021.01)
*G01K 1/024* (2021.01)
*G01K 7/02* (2021.01)
*G01K 13/08* (2006.01)
*H10N 10/17* (2023.01)
*H10N 10/80* (2023.01)

(52) U.S. Cl.
CPC ............ *G01K 13/08* (2013.01); *H10N 10/17* (2023.02); *H10N 10/80* (2023.02); *G01K 2215/00* (2013.01)

(56) References Cited

OTHER PUBLICATIONS

Dejan, M., et al., "Characterization of commercial thermoelectric modules for application in energy harvesting wireless sensor nodes," Applied Thermal Engineering 121, 2017, pp. 74-82.

* cited by examiner

AUTONOMOUS ON-BOARD TEMPERATURE MEASUREMENT DEVICE AND METHOD IMPLEMENTED BY THIS DEVICE

BACKGROUND

The invention relates to an autonomous temperature measurement device and a method implemented by this device.

The field of the invention is the field of temperature measurement devices and, more particularly, the field of autonomous on-board temperature measurement devices.

On-board temperature measurement devices comprising a battery for powering a temperature sensor are known. The autonomy of these devices is limited to the autonomy of the battery. Other on-board devices comprise a temperature sensor connected to an energy source remote from the devices. These devices allow a continuous operation of the temperature sensor but require a complex implementation.

On-board temperature measurement devices comprising a thermo-generator configured to convert thermal energy into electrical energy and connected to electronic components in order to power a temperature sensor are also known. These devices are therefore not robust and remain expensive to maintain.

An aim of the present invention is to propose a temperature measurement device that is more robust and/or less expensive and/or simpler to produce and install.

SUMMARY

At least one of the above-mentioned objectives is achieved by a temperature measurement device comprising:
  a temperature sensor arranged to measure a temperature,
  a thermo-generator forming, with said temperature sensor, a surface so-called measurement surface, said thermo-generator being configured to convert thermal energy of said measurement surface into electrical energy and said sensor being arranged to measure a temperature of a sample in contact with the measurement surface, and
  an electronic board arranged to receive the electrical energy converted by the thermo-generator and power said temperature sensor with at least some of this electrical energy;
said device being characterized in that the electronic board is arranged at a non-zero distance from said measurement surface in a direction perpendicular to said measurement surface.

With the device according to the invention, the electronic board is arranged at a distance from the measurement surface. The electronic board is thus protected from the extreme temperatures that the measurement surface presents. The device according to the invention is therefore more robust. In addition, the device according to the invention does not require connections to a power source. The device according to the invention is less expensive and less complex to implement.

The measurement surface can be at a temperature comprised between −100° C. and 500° C., in particular comprised between −50° C. and 250° C.

The electronic board can operate at maximum temperatures comprised between 85° C. and 125° C. With the arrangement at a distance from the electronic board, the device according to the invention works for a measurement surface having temperatures higher than those tolerated by the electronic board.

Advantageously, the device according to the invention can comprise an opening on the side of the measurement surface in order to allow a contact between the measurement surface and the sample.

The opening can have the dimensions of the measurement surface.

In an embodiment version of the device according to the invention, the temperature sensor and/or the thermo-generator can be located between the measurement surface and the electronic board.

In an advantageous embodiment of the device according to the invention, the electronic board can comprise at least one voltage converter connecting the thermo-generator to the temperature sensor.

In particular, the voltage converter can be configured to increase the voltage generated by the thermo-generator.

Preferably, the electronic board can comprise a microcontroller arranged to control:
  at least one means for storing the electrical energy converted by the thermo-generator and arranged to power the temperature sensor with at least some of this stored electrical energy, and/or
  a means for communicating a temperature measurement of said temperature sensor with a remote server.

The remote server can be arranged at a distance comprised between 1 m and 25 km from the device according to the invention.

In particular, the microcontroller can be arranged to control the voltage converter.

Advantageously, the temperature sensor can be a thermocouple.

The electronic board can comprise an analogue-to-digital converter in order to convert the measurement of the temperature sensor into a digital item of temperature measurement data.

Alternatively, or in addition, the temperature sensor can be any digital temperature sensor.

Preferably, the thermo-generator can be a Peltier module.

In particular, the thermo-generator can be a Peltier module of the three-dimensional solid type or of the microelectromechanical system ("MEMS") type.

In a particular embodiment version of the device according to the invention, the thermo-generator can comprise a surface, so-called dissipation surface, arranged to be at a temperature differing from the temperature of the measurement surface so as to generate the electrical energy as a function of the temperature difference between the measurement surface and the dissipation surface.

The electrical energy generated can be proportional to the temperature difference between the measurement surface and the dissipation surface.

In an advantageous embodiment, the device according to the invention can comprise a heat sink positioned between the electronic board and the thermo-generator, and in thermal contact with the dissipation surface.

The heat sink can be arranged to cool the dissipation surface so as to lower the temperature of the dissipation surface.

Advantageously, the heat sink can be fixed to the dissipation surface in order to ensure a thermal contact using a thermal adhesive, a thermal paste, or any, flexible or rigid, adhesive material that allows a heat exchange.

Alternatively, or in addition, the heat sink can be fixed to the dissipation surface by brazing.

This arrangement allows a better heat dispersion between the dissipation surface of the thermo-generator and the heat sink. The temperature difference between the measurement surface and the dissipation surface is greater. The electrical energy generated by the thermo-generator is thus increased.

Preferably, the device according to the invention can comprise a box containing the temperature sensor, the thermo-generator and the electronic board. The measurement surface can be formed on one side of said box. The box can comprise at least one air passage opening that leads to the heat sink.

In particular, the box can comprise a plurality of openings located on at least two faces of the box facing each other.

Said openings make it possible to produce an air flow, by natural or forced convection, passing through the heat sink. This arrangement makes it possible to dissipate the heat and/or the cold in the box and therefore at the same time to protect the electronic board and to increase the electrical energy generated.

In particular, the distance between the electronic board and the measurement surface can be greater than or equal to a minimum distance as a function of the thermal resistance of the box in order not to exceed a maximum operating temperature of the electronic board.

By way of example, for example for an aluminium box, the distance between the measurement surface and the electronic board can be greater than or equal to 1 cm, preferably greater than or equal to 1.5 cm, in particular equal to 2.5 cm.

The box of the device according to the invention can have a height, a width and/or a height comprised between 2.5 cm and 5 cm. Thus, the device according to the invention is compact and not bulky.

In an embodiment of the device according to the invention, the electronic board can be positioned in a housing thermally insulating it from the measurement surface.

The housing can comprise a thermally insulating material, such as polyurethane foam.

The housing can be located in the box and can comprise at least one opening allowing a cable connecting the electronic board to the thermo-generator to pass through.

According to an embodiment, the device according to the invention can comprise at least one means for measuring an item of data relating to the environment of said device and the electronic board can be arranged to power said measurement means with at least some of the electrical energy converted by the thermo-generator.

The measurement means can be a sensor such as a force sensor, a pressure sensor, a humidity sensor, etc.

In particular, the measurement means can be positioned at the level of the measurement surface.

Advantageously, the thermo-generator can comprise the temperature sensor and/or at least one measurement means.

In an advantageous embodiment, the device according to the invention can comprise means for fixing the measurement surface to the sample.

The fixing means can be any type of detachable or non-detachable fixing means, such as means for fixing by clips, by screwing, by gluing, by interlocking, etc.

According to an aspect of the invention, a temperature measurement system is proposed comprising a device according to the invention assembled with a sample, characterized in that the measurement surface formed by the thermo-generator and the temperature sensor is in thermal contact with the sample so as to measure a temperature thereof.

In particular, the sample can be a part of a vehicle or an element of pipework. Preferably, in the case of an element of pipework, the device according to the invention is not inside this element of pipework but only the measurement surface of the thermo-generator is in contact with a single outer face of this element of pipework.

According to an aspect of the invention, a vehicle, in particular a rail vehicle, is proposed comprising at least one device according to the invention, the measurement surface of which is located at the level of at least one axle box of said vehicle and provided to measure a temperature of said at least one axle box.

According to an aspect of the invention, a method for measuring the temperature of a sample comprising at least the following steps is proposed:

conversion of thermal energy of a surface, so-called measurement surface, formed by a thermo-generator and a temperature sensor in thermal contact with the sample, into electrical energy by said thermo-generator, receipt of said converted electrical energy by an electronic board in order to power said temperature sensor with at least some of this electrical energy, said method being characterized in that the electronic board is arranged at a non-zero distance from said measurement surface in a direction perpendicular to said measurement surface.

In particular, the temperature sensor and/or the thermo-generator can be located between the measurement surface and the electronic board.

Advantageously, the method according to the invention can comprise a step of increasing a voltage of the converted electrical energy by at least one voltage converter connecting the thermo-generator to the temperature sensor.

In an embodiment version, the method according to the invention can comprise:

at least one step of storage of the electrical energy converted by the thermo-generator by at least one storage means arranged to power the temperature sensor with at least some of this stored electrical energy, and/or at least one step of communication of a temperature measurement of said sensor with a remote server.

Preferably, the method according to the invention can comprise a step of thermal dissipation of a surface, so-called dissipation surface, of the thermo-generator opposite the measurement surface so that the temperature of the dissipation surface differs from the temperature of the measurement surface.

In an embodiment, the step of thermal dissipation can be carried out by a heat sink arranged between the electronic board and the thermo-generator, and in thermal contact with the dissipation surface.

In an embodiment, the step of thermal dissipation can moreover be carried out by an air flow passing into the heat sink and generated by at least one air passage opening that leads to the heat sink.

BRIEF DESCRIPTION OF THE DRAWINGS

Other advantages and characteristics will become apparent on examination of the detailed description of embodiment examples that are in no way limitative, and from the attached drawings, in which.

It is well understood that the embodiments that will be described hereinafter are in no way limitative. Variants of the invention can be envisaged in particular comprising only a selection of the characteristics described hereinafter, in isolation from the other characteristics described, if this selection of characteristics is sufficient to confer a technical advantage or to differentiate the invention with respect to the state of the prior art. This selection comprises at least one, preferably functional, characteristic without structural details, or with only a part of the structural details if this part alone is sufficient to confer a technical advantage or to differentiate the invention with respect to the state of the prior art.

DETAILED DESCRIPTION

Figure 1:
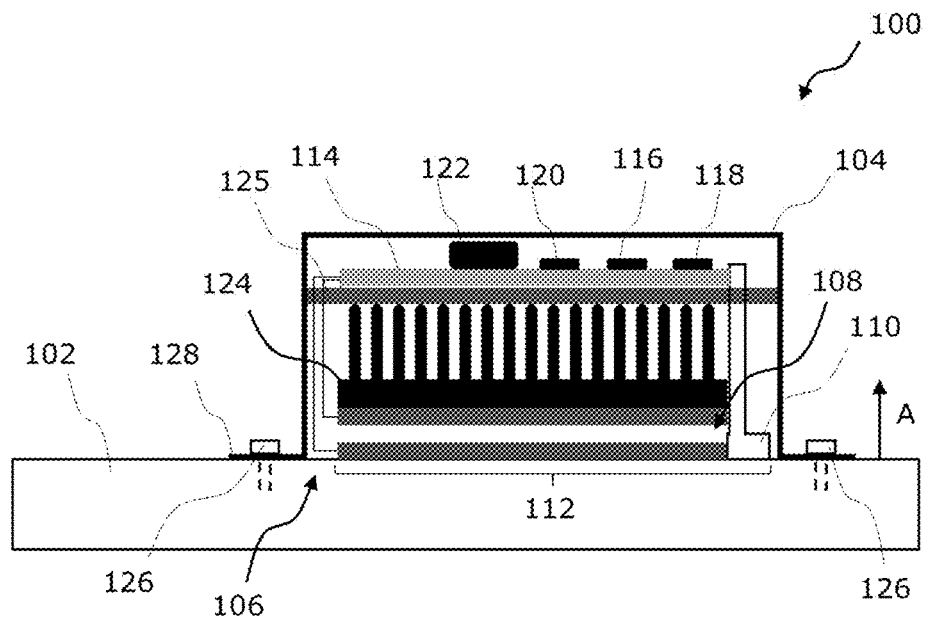
FIG. 1 is a diagrammatic representation of a cross section of a first example of the device according to the invention.

FIG. 1 is a diagrammatic representation of a cross section of a first example of the device according to the invention.

The device 100 is provided for measuring the temperature of a sample 102; said temperature can be comprised between −50° C. and 250° C. The device 100 comprises a box 104 comprising at least one opening 106 on the side of the sample 102.

The box 104 is made of aluminium. In a variant, the box 104 is made of polyurethane.

The device 100 comprises a thermo-generator 108 and a temperature sensor 110 located on the side of the opening 106. The thermo-generator 108 and the temperature sensor 110 form, on the side of the opening 106, a surface 112 so-called measurement surface 112. This measurement surface 112 is flat.

The measurement surface 112 is kept in thermal contact with the sample 102.

The temperature sensor 110 is configured to measure a temperature of the sample 102 and the thermo-generator 108 is arranged to convert thermal energy of the measurement surface 112 into electrical energy in order to power the temperature sensor 110. In particular, the thermo-generator 108 is preferably a Peltier module.

The device 100 also comprises an electronic board 114 configured, on the one hand, to receive electrical energy converted by the thermo-generator 108 and, on the other hand, to power the temperature sensor 110 with this electrical energy. The thermo-generator 108 and the temperature sensor 110 are positioned between the measurement surface 112 and the electronic board 114.

The electronic board 114 comprises a voltage converter 116, in particular of the step-up type, connected to the thermo-generator 108. The voltage converter 116 is arranged to increase a voltage converted by the thermo-generator 108 comprised between 30 and 500 mV to a voltage comprised between 2 and 5 V.

The electronic board 114 also comprises a capacitor 118, of the supercapacitor type, configured to store the electrical energy generated by the thermo-generator 108. The capacitor 118 is connected to the voltage converter 116 and stores the electrical energy at the voltage provided by the voltage converter 116. The capacitor 118 is connected to the temperature sensor 110 and is configured to power it.

The device 100 moreover comprises a communication means 120, to a remote server, of data relating to a temperature measured by the temperature sensor 110. The communication means 120 is integrated in the electronic board 114 and can be any wireless communication means, such as Bluetooth®, Wi-Fi™, LoRa, SigFox, etc. The communication means 120 is also arranged to receive control data from the remote server.

The device 100 comprises a microcontroller 122 provided to control the electronic components of the electronic board 114. For example, the microcontroller 122 controls the storage of the converted electrical energy by the capacitor 118. The microcontroller 122 also controls the powering of the temperature sensor 110 and the transmission of a temperature measurement of the temperature sensor 110 by the communication means 120.

The electronic board 114 is positioned at a non-zero distance from the measurement surface 112, this measurement distance being measured in a direction A perpendicular to the measurement surface 112. This arrangement makes it possible to limit the temperatures to which the components of the electronic board 114 are subjected. The distance between the measurement surface 112 and the electronic board 114 is greater than 1 cm, preferably greater than 1.5 cm, for example equal to 2.5 cm. Contrary to the state of the art, the electronic components of the device 100 are not exposed to high temperatures, which improves the robustness of the device 100.

The device 100 comprises a heat sink 124 arranged between the thermo-generator 108 and the electronic board 114. The heat sink 124 is arranged in thermal contact with a surface, so-called dissipation surface, of the thermo-generator 108, opposite the measurement surface 112. The heat sink 124 keeps the dissipation surface at a temperature differing from the temperature of the measurement surface 112. The thermo-generator 108 generates electrical energy as a function of the temperature difference between the measurement surface 112 and the dissipation surface. The heat sink 124 is made of metal and/or plastic. The heat sink 124 is bonded to the dissipation surface, using a thermal adhesive and/or an adhesive paste, in order to ensure a thermal contact with said surface. This arrangement allows a better dispersion of the thermal energy of the dissipation surface and therefore a greater temperature difference between the measurement surface 112 and the dissipation surface. The electrical energy generated by the thermo-generator 108 is thus increased.

One of the advantages of this embodiment stacking the thermo-generator 108 and the electronic board 114 is to make it possible to limit the area of contact of the device 100 with the sample 102 almost only to the thermo-generator 108 and therefore to optimize the power recovered by the device 100 because almost all of this area of contact is occupied by the thermo-generator 108 and therefore works in a useful manner.

The device 100 comprises a wall 125 dividing the box 104 into compartments forming at least one housing comprising the electronic board 114. The housing is arranged to insulate the electronic board 114 thermally from the measurement surface 112. For example, the housing comprises polyurethane foam in order to insulate the electronic board 114. In addition, the wall 125 is in thermal contact with the heat sink 124 so as to keep the electronic board 114 at an operating temperature of the electronic components.

The device 100 comprises screws 126 for fixing the box 104 to the sample 102, through the fixing tongues 128 provided in the box 104. The fixing screws 126 and the fixing tongues 128 are arranged to keep the measurement surface 112 in contact with the sample 102.

Preferably, the sample 102 is an axle box of a rail vehicle and the device 100 is configured to measure a temperature of said axle box, by having the measurement surface 112 in thermal contact with the axle box.

Figure 2:
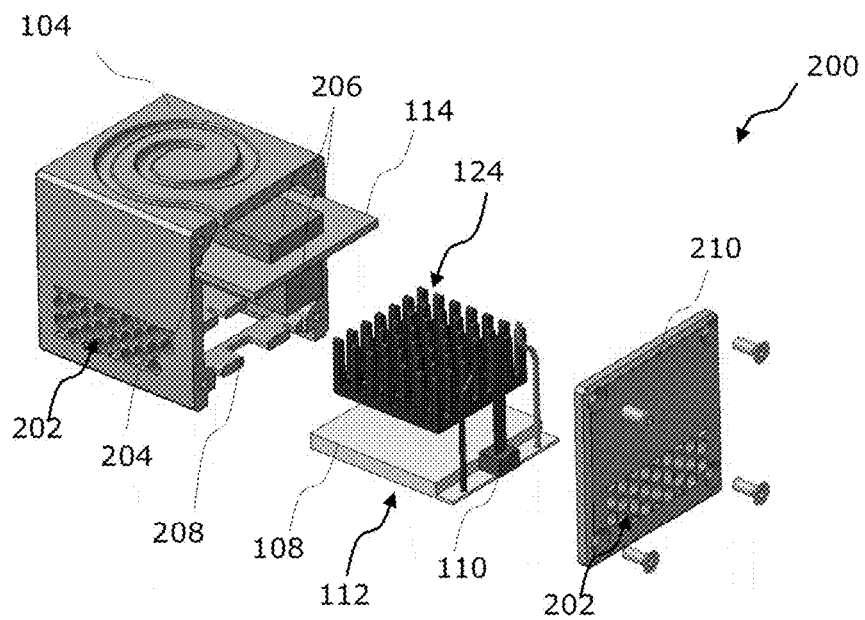
FIG. 2 is a diagrammatic representation of an exploded perspective view of a second example of the device according to the invention.

FIG. 2 is a diagrammatic representation of an exploded perspective view of a second example of the device according to the invention.

The device 200 comprises the same elements as the device 100 of FIG. 1. In addition, the device 200 comprises openings 202 provided for the passage of air into the box 104. The openings 202 are located on side walls of the box 104 leading to the heat sink 124.

Moreover, the electronic board 114 comprises electronic components 206, such as the voltage converter 116, the capacitor 118, the communication means 120, etc., positioned on the two faces of the electronic board 114. The box 104 comprises two grooves 204 arranged to receive the electronic board 114 and to hold it in the box 104.

The box 104 also comprises a separator 208 on which the heat sink 124 is arranged and makes it possible to hold it at the level of the dissipation surface of the thermo-generator 108.

Furthermore, the temperature sensor 110 is integrated in the thermo-generator 108. The temperature sensor 110 and thermo-generator 108 assembly is fixed to the separator 208 for example by clips or by interlocking.

The dimensions of the box 104 are 3 cm×3 cm×3 cm and the electronic board 114 is arranged at a distance of 2.5 cm from the measurement surface 112.

The box 104 comprises a detachable wall 210 that allows access to the components of the device 200 for the assembly or maintenance of the device 200. The implementation of the device 200 is thus simpler.

In particular, for a sample having a temperature of 100° C., the electronic board 114 is kept at a temperature of 50° C., complying with the operating temperature of the components 206, by the device 200 according to the invention.

Figure 3:
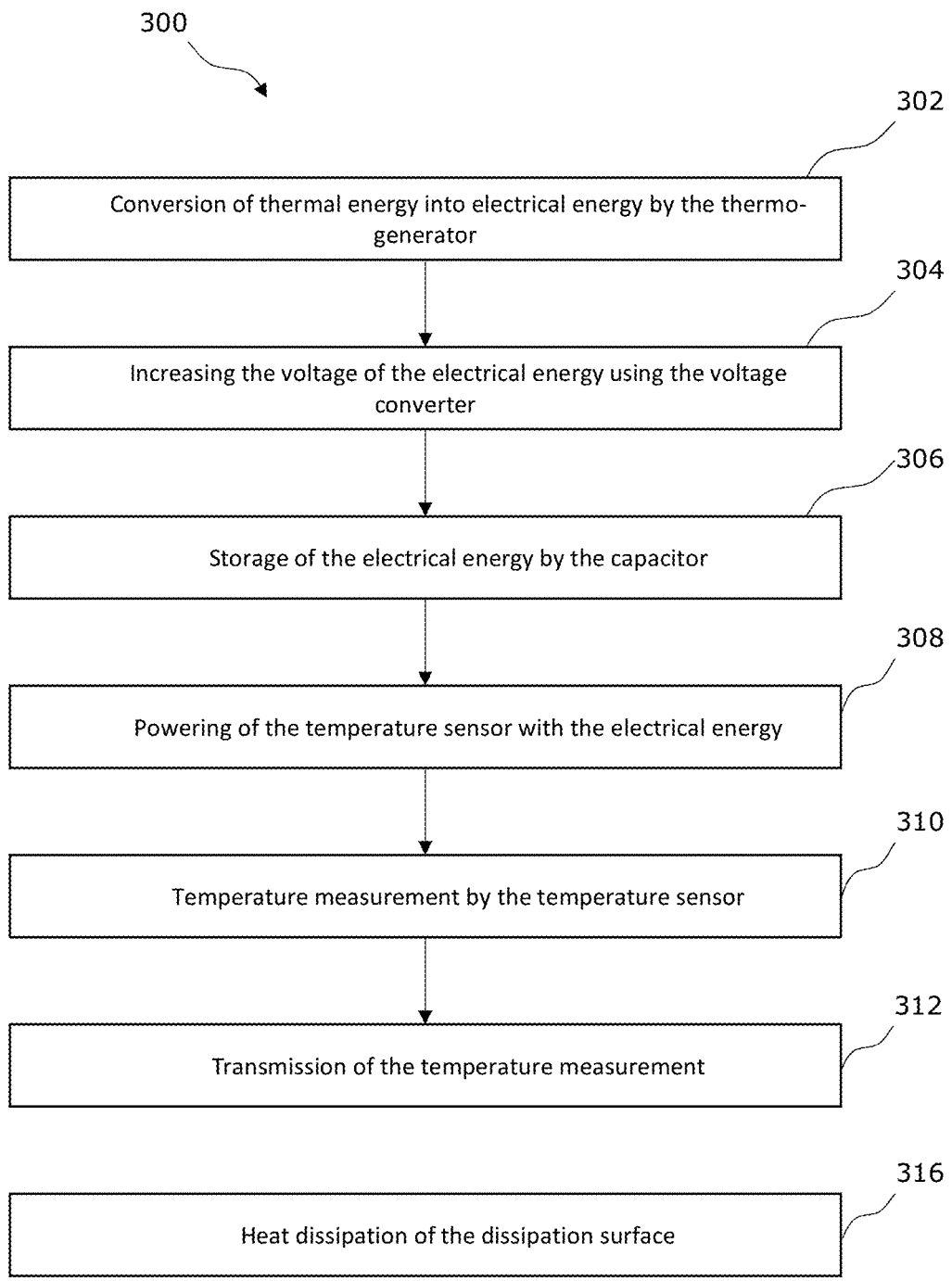
FIG. 3 is a diagrammatic representation of an example of the method according to the invention.

FIG. 3 is a diagrammatic representation of an example of the method according to the invention.

The method 300 is a temperature measurement method implemented by the device 100 of FIG. 1 and/or the device 200 of FIG. 2.

The method 300 comprises a step 302 of conversion of thermal energy into electrical energy by the thermo-generator 102.

Then, the method 300 comprises a step 304 of increasing the voltage of the electrical energy using the voltage converter 116.

The method 300 also comprises a step 306 of increasing the voltage of the electrical energy using the capacitor 118.

The method 300 also comprises a step 308 of powering of the temperature sensor 110 with the electrical energy stored by the capacitor 118.

Then, the method 300 comprises a step 310 of temperature measurement by the temperature sensor 110.

The method 300 moreover comprises a step 312 of transmission of the temperature measurement by the data communication means 120.

The method 300 also comprises a step 316 of thermal dissipation of the dissipation surface of the thermo-generator 108. This step 312 is carried out by the heat sink 124.

Step 316 of the method 300 implemented by the device 200 is, moreover, carried out by an air flow passing into the heat sink 124 and generated by the air passage openings 202. This step 316 is implemented simultaneously with each of steps 302, 304, 306, 308, 310, and 312.

Of course, the invention is not limited to the examples that have just been described, and numerous modifications may be made to these examples without exceeding the scope of the invention.

The invention claimed is:

1. A temperature measurement device comprising:
    a temperature sensor arranged to measure a temperature;
    a thermo-generator forming, with said temperature sensor, a surface so-called measurement surface, said thermo-generator being configured to convert thermal energy of said measurement surface into electrical energy and said sensor being arranged to measure a temperature of a sample in contact with the measurement surface;
    an electronic board arranged to receive the electrical energy converted by the thermo-generator and power said temperature sensor with at least some of this electrical energy;
    the electronic board is arranged at a non-zero distance from said measurement surface in a direction (A) perpendicular to said measurement surface;
    the temperature measurement device further comprises a heat sink positioned vertically between the electronic board and the thermo-generator; and
    a box enclosing the electronic board and the heat sink.

2. The device according to claim 1, characterized in that the temperature sensor and/or the thermo-generator are located between the measurement surface and the electronic board.

3. The device according to claim 1, characterized in that the electronic board comprises at least one voltage converter connecting the thermo-generator to the temperature sensor.

4. The device according to claim 1, characterized in that the electronic board comprises a microcontroller arranged to control:
    at least one means for storing the electrical energy converted by the thermo-generator and arranged to power the temperature sensor with at least some of this stored electrical energy; and/or
    a means for communicating a temperature measurement of said temperature sensor with a remote server.

5. The device according to claim 1, characterized in that the box is configured for containing the temperature sensor s and the thermo-generator, and in that:
    the measurement surface is formed on one side of said box, and
    the box comprises at least one air passage opening that leads to the heat sink.

6. The device according to claim 1, characterized in that the electronic board is positioned in a housing thermally insulating it from the measurement surface.

7. The device according to claim 1, characterized in that it comprises at least one means for measuring an item of data relating to the environment of said device and in that the electronic board is arranged to power said measurement means with at least some of the electrical energy converted by the thermo-generator.

8. The device according to claim 1, characterized in that it comprises means for fixing the measurement surface to the sample.

9. A temperature measurement system comprising a device according to claim 1 assembled with a sample, characterized in that the measurement surface formed by the thermo-generator and the temperature sensor is in thermal contact with the sample so as to measure a temperature thereof.

10. A vehicle comprising at least one device according to claim 1, the measurement surface of which is located at the level of at least one axle box of said vehicle and provided to measure a temperature of said at least one axle box.

11. A method for measuring the temperature of a sample by using a device according to claim 1, the method comprising at least the following steps:

conversion of thermal energy of a surface, so-called measurement surface, formed by a thermo-generator and a temperature sensor in thermal contact with the sample, into electrical energy by said thermo-generator;

receipt (308) of said converted electrical energy by an electronic board in order to power said temperature sensor with at least some of this electrical energy; and the electronic board is arranged at a non-zero distance from said measurement surface in a direction (A) perpendicular to said measurement surface.

12. The method according to claim 11, characterized in that it comprises a step of increasing a voltage of the converted electrical energy by at least one voltage converter connecting the thermo-generator to the temperature sensor.

13. The method according to claim 11, characterized in that it comprises:

at least one step of storage of the electrical energy converted by the thermo-generator by at least one storage means arranged to power the temperature sensor with at least some of this stored electrical energy, and/or at least one step of communication of a temperature measurement of said sensor with a remote server.

14. The method according to claim 11, characterized in that it comprises a step of thermal dissipation of a surface, so-called dissipation surface, of the thermo-generator opposite the measurement surface so that the temperature of the dissipation surface differs from the temperature of the measurement surface.

15. The method according to claim 14, characterized in that the thermal dissipation step is carried out by a heat sink arranged between the electronic board and the thermo-generator, and in thermal contact with the dissipation surface.

16. The method according to claim 14, characterized in that the thermal dissipation step is moreover carried out by an air flow passing into the heat sink and generated by at least one air passage opening that leads to the heat sink.

17. A temperature measurement device comprising:

a temperature sensor arranged to measure a temperature;

a thermo-generator forming, with said temperature sensor, a surface so-called measurement surface, said thermo-generator being configured to convert thermal energy of said measurement surface into electrical energy and said sensor being arranged to measure a temperature of a sample in contact with the measurement surface;

an electronic board arranged to receive the electrical energy converted by the thermo-generator and power said temperature sensor with at least some of this electrical energy; and the electronic board is arranged at a non-zero distance from said measurement surface in a direction (A) perpendicular to said measurement surface;

the thermo-generator comprises a dissipation surface, arranged to be at a temperature differing from the temperature of the measurement surface so as to generate electrical energy as a function of the temperature difference between the measurement surface and the dissipation surface; and the temperature measurement device further comprises a heat sink positioned between the electronic board and the thermo-generator, and in thermal contact with the dissipation surface.

* * * * *